(12) United States Patent
Gupta et al.

(10) Patent No.: US 10,387,278 B2
(45) Date of Patent: Aug. 20, 2019

(54) METHOD TO DISPLAY REAL-TIME MODULE OIR TIME

(71) Applicant: Cisco Technology, Inc., San Jose, CA (US)

(72) Inventors: Rohit Dev Gupta, Bangalore (IN); Joel R. Goergen, Soulsbyville, CA (US); Jatin Kohli, Bangalore (IN); Manigandan Boopalan, Bangalore (IN)

(73) Assignee: Cisco Technology, Inc., San Jose, CA (US)

( * ) Notice: Subject to any disclaimer, the term of this patent is extended or adjusted under 35 U.S.C. 154(b) by 213 days.

(21) Appl. No.: 15/643,661

(22) Filed: Jul. 7, 2017

(65) Prior Publication Data

US 2018/0285222 A1 Oct. 4, 2018

Related U.S. Application Data

(60) Provisional application No. 62/479,417, filed on Mar. 31, 2017.

(51) Int. Cl.
*G06F 11/00* (2006.01)
*G06F 11/20* (2006.01)
*G06F 11/30* (2006.01)
*G06F 11/32* (2006.01)
*H05K 7/20* (2006.01)

(52) U.S. Cl.
CPC ...... *G06F 11/2028* (2013.01); *G06F 11/3024* (2013.01); *G06F 11/328* (2013.01); *H05K 7/20836* (2013.01); *G06F 2201/805* (2013.01); *G06F 2201/86* (2013.01)

(58) Field of Classification Search
CPC .... G06F 11/20; G06F 11/2028; G06F 11/142; G06F 11/2005; G06F 11/2007; G06F 11/2023; G06F 11/2092
USPC ........................................ 714/13, 20
See application file for complete search history.

(56) References Cited

U.S. PATENT DOCUMENTS

| 7,363,260 | B1 * | 4/2008 | Stamler ............... G06Q 10/087 705/28 |
| 7,621,460 | B2 * | 11/2009 | Dorr ....................... G06F 1/184 236/49.3 |
| 2001/0032280 | A1 * | 10/2001 | Osakada ............ G06F 13/4022 710/305 |
| 2005/0254210 | A1 | 11/2005 | Grady et al. |
| 2008/0126631 | A1 * | 5/2008 | Bailey .................. G06F 3/0607 710/74 |

(Continued)

OTHER PUBLICATIONS

Whirlpool Dishwasher Error Codes—Lights Blinking Flashing; http://removeandreplace.com/2016/03/09/whirlpool-dishwasher-error-codes-lights-blinking-flashing; pp. 1-36.

(Continued)

*Primary Examiner* — Sarai E Butler
(74) *Attorney, Agent, or Firm* — Behmke Innovation Group LLC; James Behmke; Stephen D. LeBarron

(57) ABSTRACT

In one embodiment, a device in a modular networking rack determines an online insertion and removal (OIR) time for a particular device module of a plurality of device modules contained within the modular networking rack. The device determines an OIR time for the plurality of device modules based on the OIR time for the particular device module and provides an indication of the OIR time for the plurality of device modules for display to a user.

20 Claims, 7 Drawing Sheets

(56) References Cited

U.S. PATENT DOCUMENTS

| | | | |
|---|---|---|---|
| 2013/0148292 A1 | 6/2013 | Shih | |
| 2013/0194755 A1* | 8/2013 | Ling | H05K 7/20545 361/721 |
| 2015/0216069 A1 | 7/2015 | Hori | |
| 2015/0369253 A1 | 12/2015 | Ragupathi et al. | |

OTHER PUBLICATIONS

What do the error/information codes indicate? (LS-WVL, LS-WXL series); https://josephlo.wordpress.com/2011/07/17/what-do-the-errorinformation-codes-indicate-ls-wvl-ls-wxl-series; pp. 1-5.
Diagnostic and Troubleshooting Golf Cart; HPEVS: Hi Performance Electric Vehicle Systems; Revision: A Date: Sep. 25, 2013; pp. 1-11.
International Search Report dated Jun. 14, 2018 in connection with PCT/US2018/023454.

\* cited by examiner

METHOD TO DISPLAY REAL-TIME MODULE OIR TIME

CROSS-REFERENCE TO RELATED APPLICATION

This application claims the benefit of U.S. Provisional Application No. 62/479,417, entitled METHOD TO DISPLAY REAL-TIME MODULE OIR TIME, by Gupta et all, filed Mar. 31, 2017, the disclosure of which is incorporated herein by reference.

TECHNICAL FIELD

The present disclosure relates generally to computer networks, and, more particularly, to a method to display real-time module online insertion & removal (OIR) time.

BACKGROUND

In a modular configuration system, online insertion & removal (OIR) is a process of replacing a faulty device module without disrupting the performance of the entire system. During this process, the system continues to be functional, and a faulty device module (e.g., a line card, a power supply, a fan tray, etc.) is replaced with a new one. In most cases, while a faulty device module is being replaced, the system is exposed to the external environment through the opening created by the missing device module. This can cause the system airflow to be unbalanced, as this empty space would offer a least resistance path and airflow would bypass through this space causing other areas and/or components to not get enough airflow for cooling.

Among all the device modules to be replaced, a fan-tray OIR is typically the most critical. Notably, if there is no redundant fan tray in the system, the system would not have any airflow for its cooling, and there could be system reliability issues due to overheating. Therefore, fan-tray OIR should be completed as soon as possible to avoid system failure. The time limit for completing the OIR would depend on the overall system configuration and traffic patterns, system ambient conditions (temperature, altitude etc.), and thermal behavior of the system.

Currently, systems are being designed to provide sufficient OIR time based on an estimated duration for device module replacement. Such a time limit is often published in hardware installation guides. However, published times are valid only for a particular system configuration at a particular ambient temperature. Any change in system configuration, such as due to an upgrade, often invalidates the published time-limits. Furthermore, many installations have shifted from an ambient temperature of 23° C. in the 1990s to 30° C. ambient temperature today as a means to save on massive electrical bills.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

According to one or more embodiments of the disclosure, a device in a modular networking rack determines an online insertion and removal (OIR) time for a particular device module of a plurality of device modules contained within the modular networking rack. The device determines an OIR time for the plurality of device modules based on the OIR time for the particular device module and provides an indication of the OIR time for the plurality of device modules for display to a user.

DESCRIPTION

As noted above, online insertion and removal (OIR) is a process in which a faulty or out of date device module can be replaced without affecting system performance (e.g., within a networking rack/chassis). This process is similar to hot swapping in some ways. However, hot swapping is primarily a hardware function and generally requires no software commands, whereas OIR is typically a software feature. Notably, special software instructions are required to be executed during OIR, both before removing a device module and after installing a replacement device module. During this procedure, an identical device module should be used to replace the original one. In addition, when performing OIR on multiple device modules or components within a device (e.g., a router), the operation should typically be performed on one device module at a time.

Generally, fan tray OIR (e.g., the replacement of a faulty or out-of-date fan tray) is a special situation which should be treated carefully. For example, typically a system may be designed to operate with all fans working in a fan tray. In some cases, the system may still be capable of operating with a single fan fail, but the fan tray should be replaced with a new one at the earliest convenience. In addition, new high performance fans are being developed which provide better cooling performance, and it may be desirable to upgrade an existing fan tray with a new high performance fan tray by performing an OIR.

However, if a fan tray OIR is not completed within a prescribed time, the entire system may shut down in order to avoid overheating and damage to the device modules or components. Thus, special software (SW) monitoring is generally required during fan tray OIR to ensure that a catastrophic failure of components due to high temperatures is avoided. In other words, fan tray OIR needs to be completed within a prescribed time limit that may depend at least on the operating temperature. This would provide an estimate of the time to reach failure limit once the fan tray is removed from system.

Figure 1:
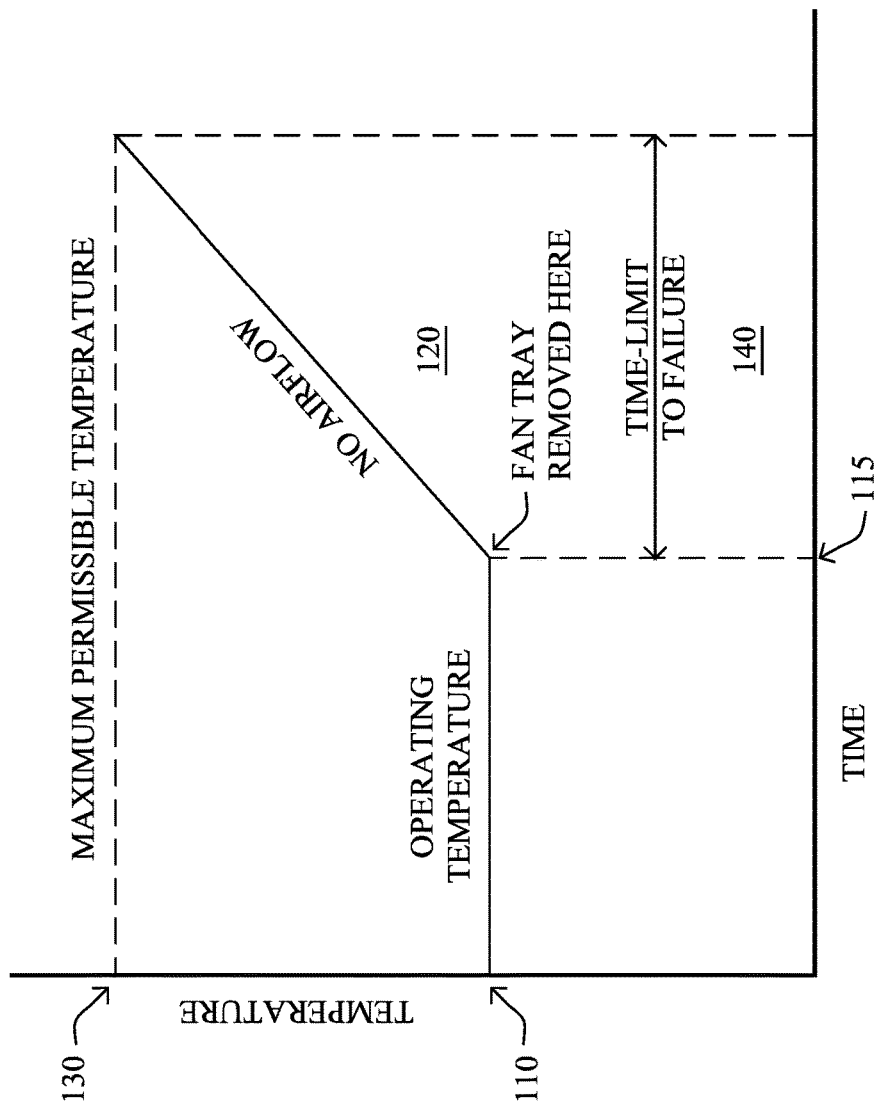
FIG. 1 illustrates an example time-temperature graph for a fan tray OIR.

An example plot of fan tray OIR time is illustrated by the time-temperature graph shown in FIG. 1. As shown, a system (e.g., a modular networking rack) including a fan tray may be operating at temperature 110, which may be relatively constant over the period of time prior to device replacement. During a fan tray OIR, initiated at time 115, the fan tray may be removed, thereby changing the conditions within the system. With no (or significantly reduced) air flow, the temperature of the system would be expected to rise, as illustrated by slope 120. If the temperature reaches maximum permissible temperature 130, system failure may occur. Thus, it is important to know the time-limit to failure 140 and to monitor the OIR process time, to be certain the time-limit is not exceeded.

Method to Display Real-Time Module OIR Time

The techniques described herein introduce several intelligent methods to determine device module OIR time in real-time and, further, to provide a visible indication (e.g., a display) of the determined OIR, thereby alerting a user (e.g., operator initiating the OIR) of the amount of time available for the device module OIR process. In this way, the user is able to avoid any network down time due to system shutdown (e.g., caused by system overheating or thermal runaway during a fan tray OIR). A variety of approaches are provided to determine device module OIR for a plurality of device modules contained within a modular networking rack and to present the OIR time information to a user. In some embodiments, an intelligent software process is used to monitor the real-time device temperature and/or system airflow for a fan tray OIR. Several mechanisms are also introduced herein to leverage the resulting information, to display the real-time OIR time-limit.

Specifically, according to one or more embodiments of the disclosure as described in detail below, a device in a modular networking rack determines an online insertion and removal (OIR) time for a particular device module of a plurality of device modules contained within the modular networking rack. The device determines an OIR time for the plurality of device modules based on the OIR time for the particular device module and provides an indication of the OIR time for the plurality of device modules for display to a user.

Illustratively, the techniques described herein may be performed by hardware, software, and/or firmware, such as in accordance with an OIR time process, which may include computer executable instructions executed by a processor, to perform functions relating to the techniques described herein.

Figure 2A:
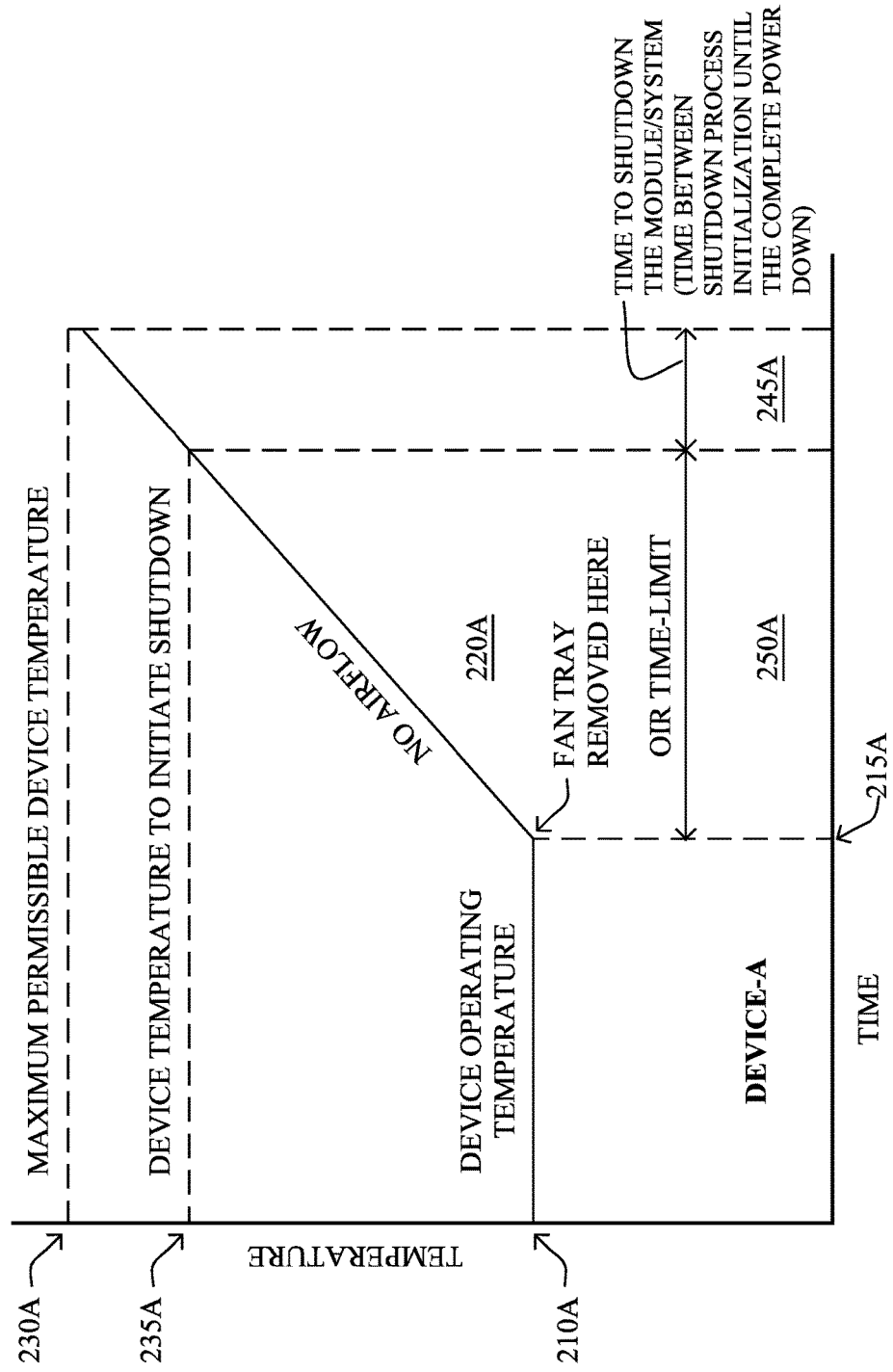
FIGS. 2A-2B illustrate example time-temperature graphs of the thermal behaviors of different devices.
Figure 2B:
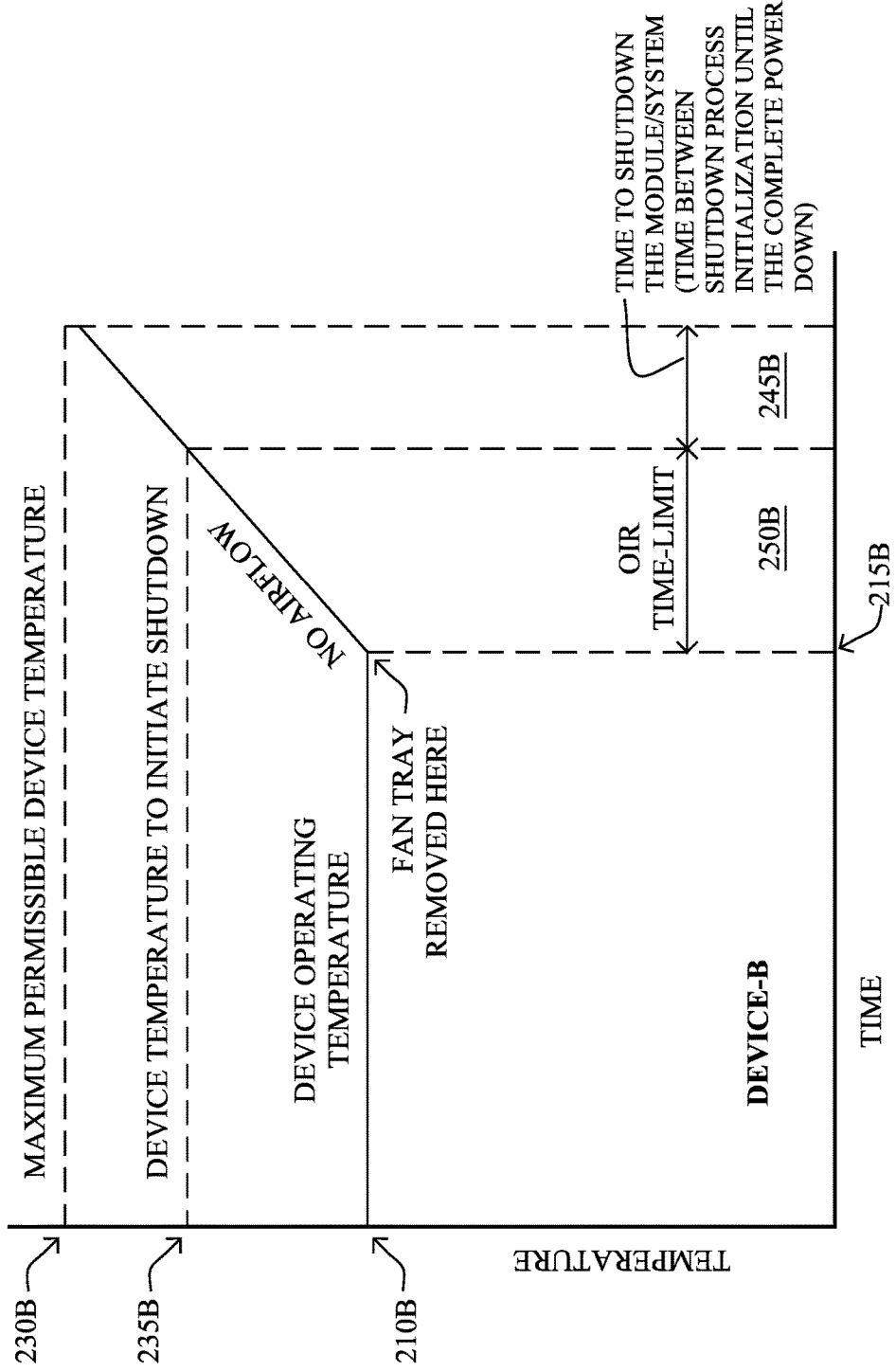

Operationally, FIG. 2A and FIG. 2B illustrate the thermal behavior of two different device modules, "Device-A" and "Device-B" respectively, which may be considered to be the thermally worst device modules for a particular modular networking rack system (e.g., device modules that are the most sensitive to fan tray removal) during a fan tray OIR. Assuming that the system is working in steady state, Device-A and Device-B would each have their own operating temperatures, 210A and 210B, depending, for example, on the type of device and its physical location within the modular networking rack. These temperatures, as well as other relevant conditions (air flow rate, power levels, etc.) may be monitored by a controlling device in the system. Both device modules would also be expected to have different power dissipation properties as well as different values of maximum permissible temperature, 230A and 230B, and different heating characteristics in no-airflow conditions (as illustrated by slopes 220A and 220B). These may be known based on the device type or determined by a controlling device in the system.

As soon as a fan tray is removed from a modular networking rack containing Device-A and Device-B, these devices will start to heat up, as per their characteristic curves. In order to avoid the temperature reaching the maximum limit (e.g., maximum permissible device temperatures 230A and 230B), the system may be configured to power down at a temperature below these limits, if the fan-tray is not inserted back in the system in time. If the time taken by the system to initiate the shutdown until complete power down is known (e.g., time to shutdown 245A and 245B), a safe operating point for the devices can be identified (e.g. temperature 235A and 235B). This safe operating point determines the particular device OIR time-limits, 250A and 250B, thereby providing sufficient time to initiate system shutdown without damaging the devices.

Upon determination of each particular device module OIR time, an OIR time for the plurality of device modules in the modular networking rack may also be determined. In particular, the OIR time for the various device modules may be compared. For example, the worst available time (e.g., the lowest device OIR time) for any device may define the OIR time limit for the system. For example, as shown in FIG. 2A and FIG. 2B, Device-B has a shorter time limit than Device-A. Therefore, the system OIR time limit may be defined by Device-B. Alternatively, consideration may also be given to the importance or sensitivity of each device module to temperature increases. If a fan tray is inserted back at the "safe operating point" for Device-B, the temperature of the system would begin to ramp down, and the system would return to its normal operating condition.

Once the device (e.g., system controller) determines an OIR time for the plurality of device modules within the rack, based on the OIR time determined for one or more individual device modules of the plurality, there are several ways this real-time information can be provided to a user. In one embodiment, the OIR time process may provide an indication of the determined system OIR time to an electronic display. For example, such a display may be a system console, LCD display on the networking rack/chassis itself, or the like. Alternatively, command line interface (CLI) commands can be published in hardware install guides, to get real time data from device running the OIR time determination process.

Figure 3:
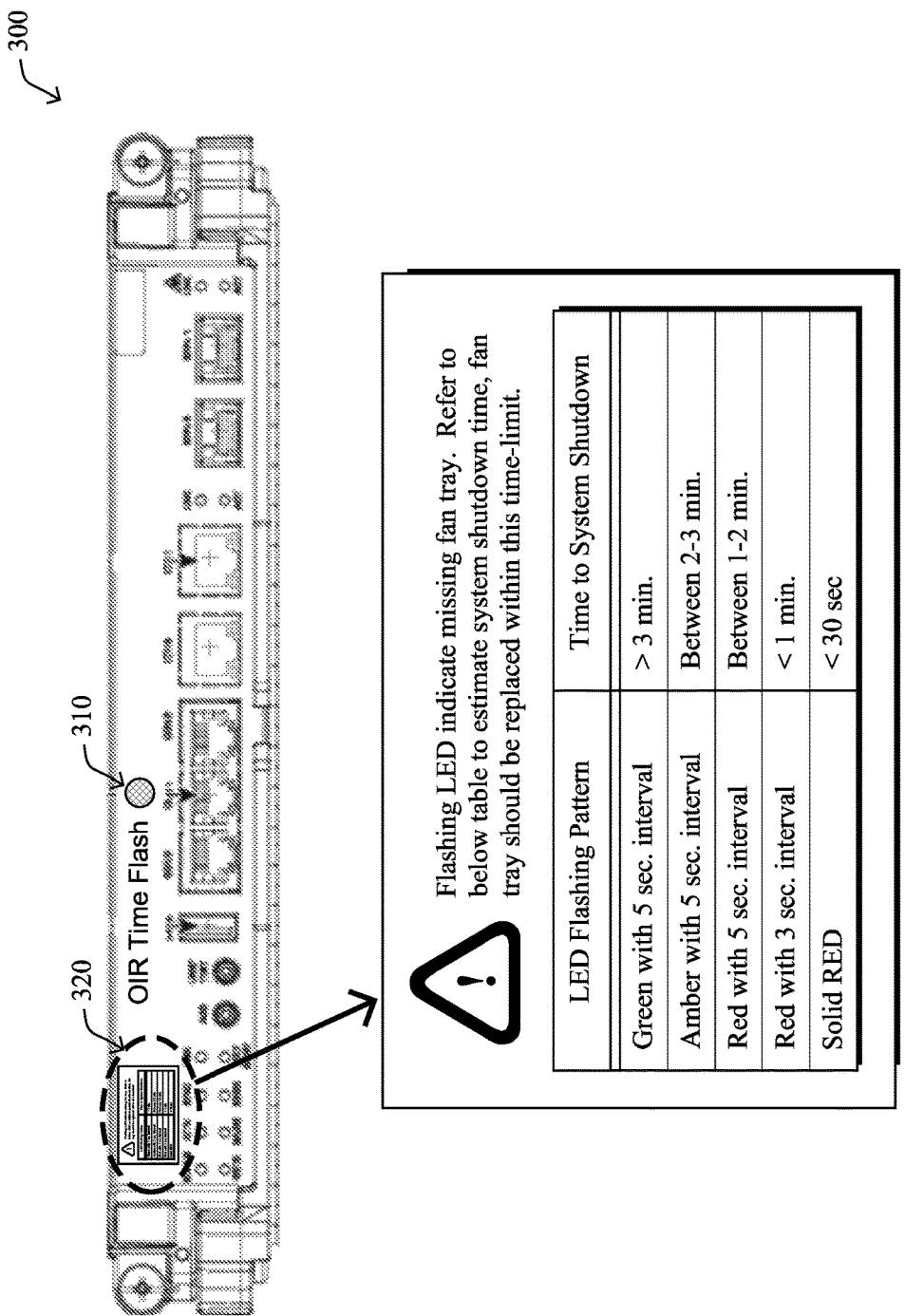
FIG. 3 illustrates an example of an LED to display an OIR time.

In one embodiment, the device/controller may output an indication of the determined OIR time for the plurality of device modules to an LED via a flash pattern. The LED may be positioned anywhere in the system, including, for example, on an interior surface of the rack or on one of the devices within the rack (e.g., a system controller, a controller card, a fan tray, or the like). For example, as shown in FIG. 3, device module 300 in may include LED 310 capable of producing a flashing pattern or other visible indication of the available OIR time as an option. In order to interpret the LED flash information for the OIR time, label 320 may be included on device 300, including, for example, flash color and/or duration and corresponding time to system shutdown), and this information may also be included in hardware install guides.

As shown in FIG. 3, the indicated flash pattern may only be configured to provide time-range information (e.g., between 2-3 minutes) rather than and an exact time-limit. Sometimes, for higher power density systems, it may be necessary to know the exact time available before system shutdown so that the device module replacement can be completed safely within the prescribed time.

Figure 4A:
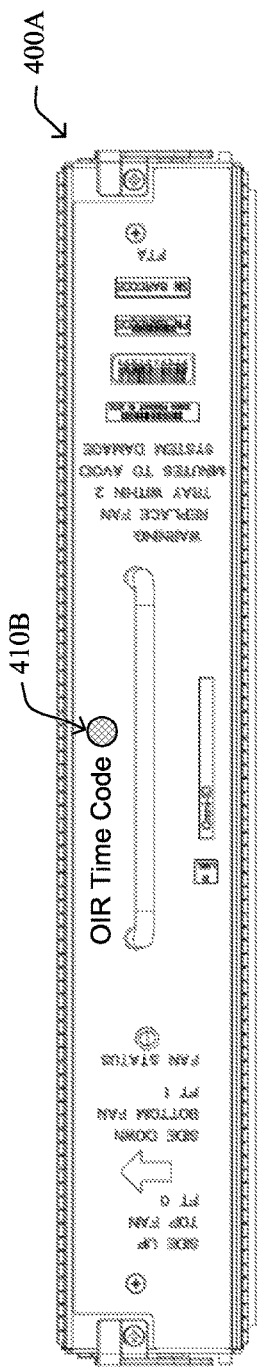
FIGS. 4A-4C illustrate further examples of LEDs to display OIR times.
Figure 4B:
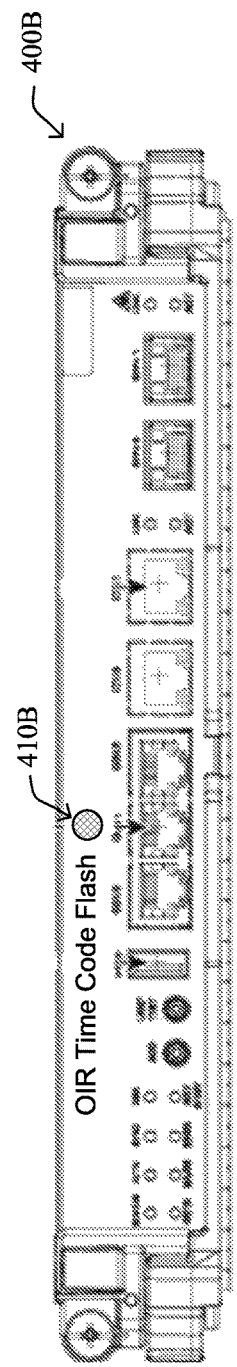
Figure 4C:
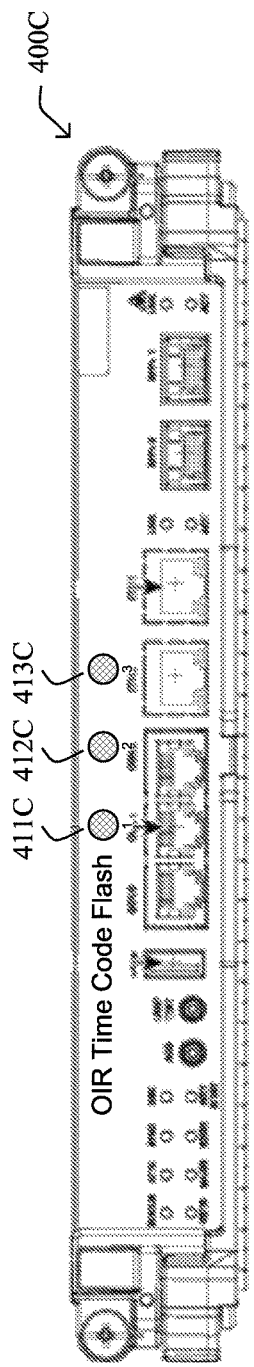

Thus, in some embodiments, a time-code flash pattern may be used to provide a visual indication to a user of an exact time available for device module OIR (e.g., via one or more LEDs). For example, as shown in FIG. 4A and FIG. 4B, single LED 410A and 410B positioned on device module 400A (which may be a fan tray, as shown) or 400B, respectively, may be provided in order to display the determined system OIR time code information using a flashing pattern and/or color to represent a number. Alternately, as shown in FIG. 4C, multiple LEDs 411C, 412C, and 413C, may flash sequentially or simultaneously, with each single LED representing a numerical digit of the system OIR time. Different LED color schemes (e.g., to represent the severity as the system approaches shutdown) can also be used.

A variety of different flash patterns (color, frequency, duration, etc.) may be used as an indication of the system OIR time. In particular, different LED colors may be used to provide numerical information of the overall OIR time. For example, if the determined OIR time for a plurality of device modules in a networking rack has 3 digits (minutes and seconds), each may be represented by a single LED (e.g., single LED 410A shown in FIG. 4A) as follows:
- a green flash with a 1 second interval—first numerical digit
- a solid green for 2 seconds—pause
- a green flash with a 1 second interval—second numerical digit
- a solid green for 2 seconds—pause
- a green flash with a 1 second interval—third numerical digit
- a solid green for 5 seconds—pause before starting next cycle In addition, the flash pattern of a single LED may further include different LED colors along with varying flash intervals to display the OIR time to a user. For example, to display a 3 digit number for a system OIR time limit (in seconds), each digit may be represented by a single LED (e.g., single LED 410B shown in FIG. 4B) as follows:
- a green flash with a 2 second interval—the first numerical digit,
- a yellow flash with a 2 second interval—the second numerical digit, and
- a red/blue flash with a 2 second interval—the third numerical digit.

Multiple LEDs may provide additional flexibility and clarity for displaying OR time code information. In particular, as shown in FIG. 4C, each LED (411C, 412C, and 413C) may be assigned to represent the position of numerical digit in the OIR time number value. For example, LED 411C may flash a pattern to represent the first numerical digit, LED 412C may flash to represent the second numerical digit, and LED 413C may flash to represent the third numerical digit. As a specific example, a time of 458 seconds may be displayed as follows:
- first LED—4 flashes with 2 second intervals (total time=8 seconds)
- pause for 2 seconds (total time=10 seconds)
- second LED—5 flashes with 2 second intervals (total time=20 seconds)
- pause for 2 seconds (total time=22 seconds)
- third LED—8 flashes with 2 second intervals (total time=38 seconds)
- pause for 2 seconds (total time=40 seconds)

Thus, the entire time code may be displayed to a user within 40 seconds, and this cycle may be repeated as needed after a gap for a few seconds, in normal operation. The frequency of display, the interval between each flash, and the color of the LED may be adjusted accordingly, and the patterns may be customized differently for each platform, considering their complexity (e.g., fan tray size, accessibility, LED location, etc.) and the device heating curves during device module OIR.

Another example of a flash pattern that can be used to provide an indication of the determined OIR time having three digits may be as follows:
If the OIR time is >4 minutes, provide a solid green
If the OIR time is <4 minutes provide a solid green for 1 minute and then
  flash green once for the first digit and then flash yellow the number of times needed to indicate the value of the first digit,
  flash green once for the second digit and then flash yellow the number of time needed to indicate the value of the second digit,
  flash green once for the third digit and then flash yellow the number of times needed to indicate the third digit
  solid green for 1 minute, and repeat the flash sequence after every 1 minute of solid LED.

In addition, the solid green may instead be green or yellow/red based on the condition of the fans of the modular networking rack (to indicate all fans are working or display a fan fail condition)

A specific example may be as follows:
If the OIR time is >4 minutes, provide a solid green
If the OIR time is <4 minutes:
  provide a solid LED for 3 seconds to represent 0 or alternatively flash LED for 1 second on and off for 1 second to represent desired numbers, with a 5 second off time before displaying the next digit
  return to solid LED after the entire code is flashed.

For this example, flash patterns may be repeated every 60 seconds from start to start.

In some embodiments, different colors of LED may be used based on available OIR time. For example,
  <4 minutes to >90 seconds, flash code in green
  <90 seconds to >60 seconds, flash code in amber
  <60 seconds, continuously flash code in red As noted above, a solid green LED may be green or yellow/red based on the condition of the fans in order to indicate all fans are working or that a fan fail condition exists.

In some embodiments, the indication of the OIR time may be provided for display to a user device, such as output via a custom smartphone application. In particular, the OIR time may be provided by connection with a network operations center (NOC) to use syslog information for real-time device temperature and to display OIR time limits. For example, by using a smartphone application, the user device may also monitor and control ambient temperature by adjusting central-office/data-center air conditioner units or other environmental control devices (or may be connected to the system controller which may be configured to adjust room temperature). The ambient temperature may thereby be lowered during OIR in order to gain additional time for module replacement. Bluetooth applications may also be used in which a Bluetooth sending unit may provide the OIR information via wireless connection to a user device (e.g., a smartphone or other handheld personal digital assistant) for immediate display.

Figure 5:
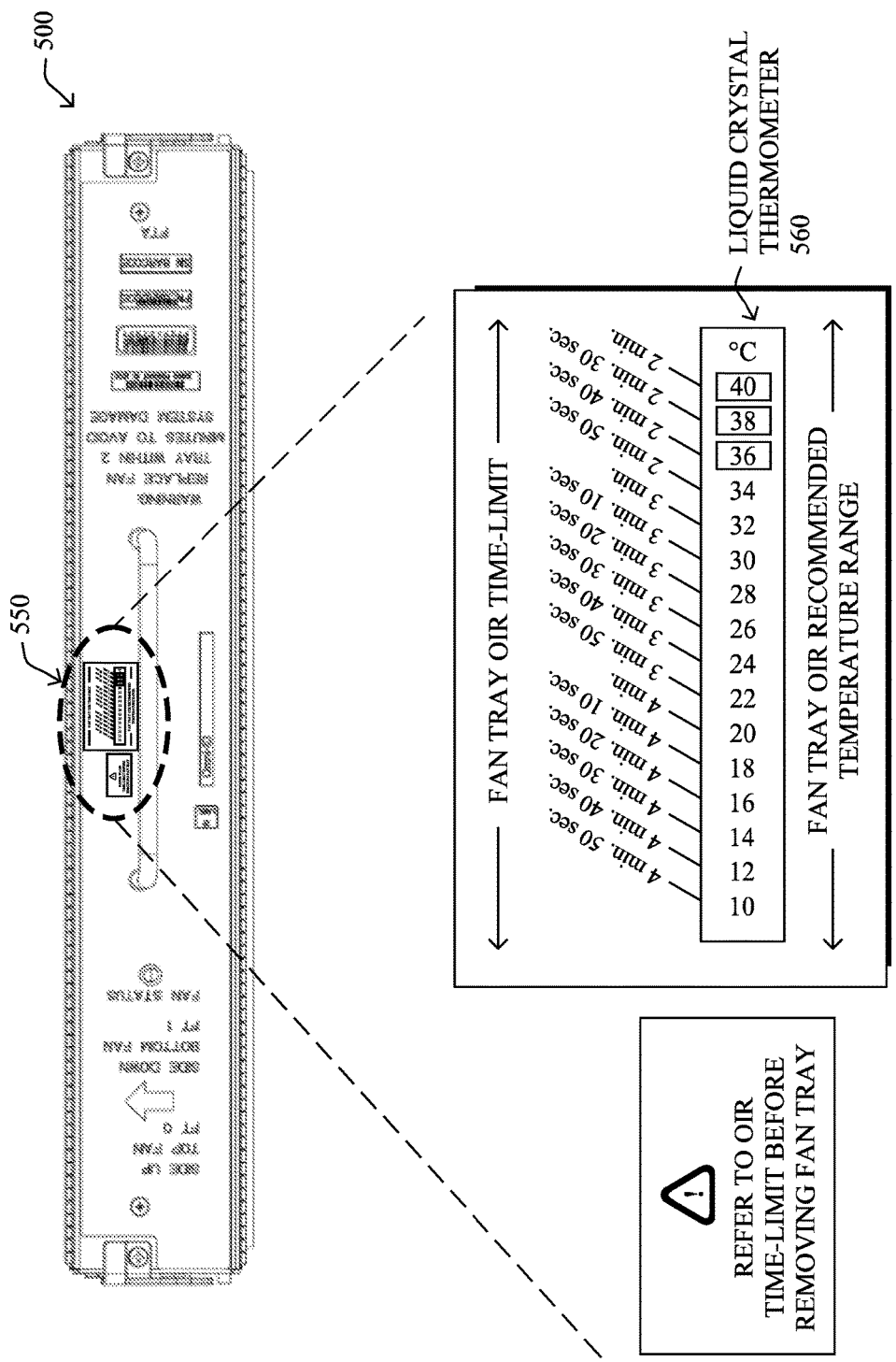
FIG. 5 illustrates an example of a liquid crystal sensor to display an OIR time.

In some embodiments, a liquid crystal sensor may be used to indicate the OIR time information to a user. In general, liquid crystal sensors use heat-sensitive (thermo-chromic) liquid crystals in a plastic strip which change color based on the ambient temperature. In particular, as shown in FIG. 5, device module 500 may include label 550 comprising liquid crystal thermometer 560 to display the ambient temperature around the modular networking rack containing the device module and, further, to mark the corresponding OIR time-limit. While this approach does not provide the OIR time as real time data but rather indicates the time-limit tested for a worst possible configuration for different operating ambient temperatures, label 550 positioned on a device module (such as a fan-tray) would provide a quick reference to an operator/user for the available time for device module replacement to be completed. In the case of a device module upgrade which could change the thermal profile of the system (e.g., high power, high airflow resistance, device thermal parameters), these time-limits would also need to be updated with a new label.

Figure 6:
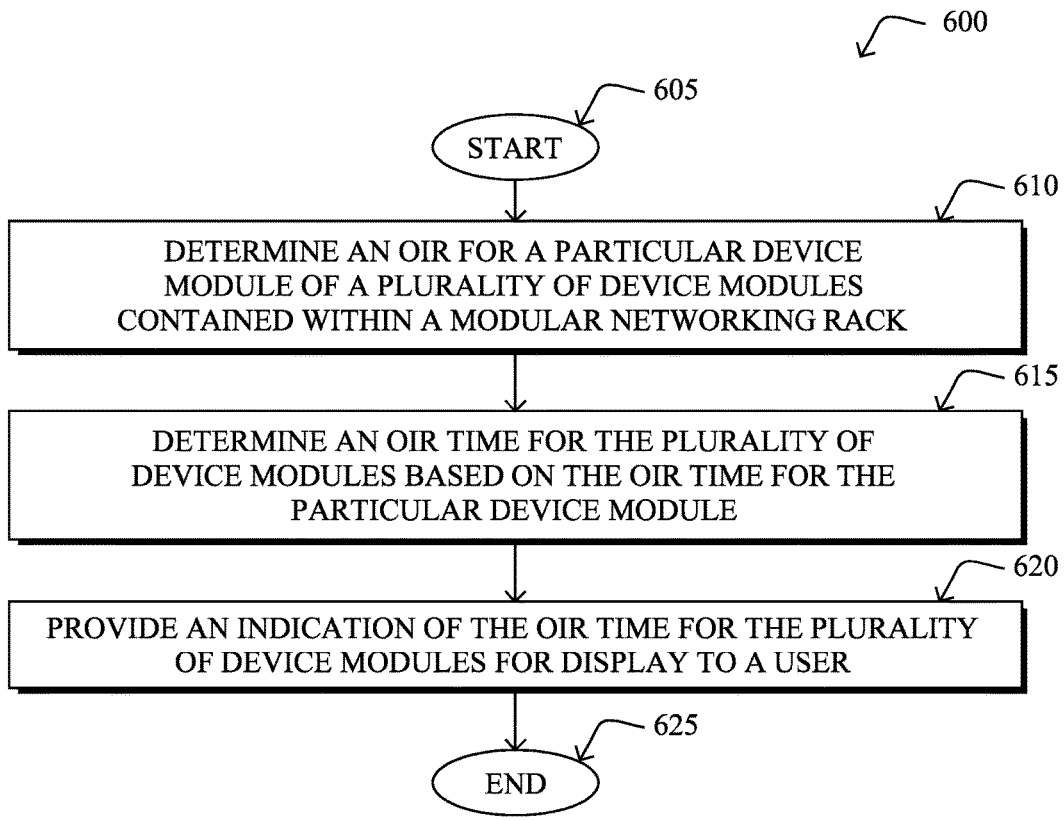
FIG. 6 illustrates an example simplified procedure for displaying real-time OIR time.

FIG. 6 illustrates an example simplified procedure for displaying real-time module OIR time in accordance with one or more embodiments described herein. For example, a non-generic, specifically configured device (e.g., a system controller) may perform procedure 600 by executing stored instructions (e.g., an OIR determination and display process).

Procedure 600 may start at step 605 and continue to step 610, where, as described in greater detail above, a device determines an OIR time for a particular device module of a plurality of device modules in a modular networking rack. The particular device module may be a line card, a fabric card, a route processor card, a power supply, or a fan tray. In some embodiments, the OIR time is the time needed to remove a fan tray from the modular networking rack. The device may determine the OIR time based on the operating temperature of the particular device, the air flow rate at the particular device module, a power dissipation rate of the particular device module, a maximum permissible temperature for the particular device module, a heating characteristic in no-airflow conditions for the particular device module, or combinations thereof.

In step 615, as described in greater detail above, the device determines an OIR time for the plurality of device modules, based on the determined OIR time for the particular device module. In some embodiments, the device may compare the OIR of several particular device modules and determine, from the comparison, a minimum OIR is time for the plurality of device modules. Other factors may include device sensitivity, importance within the system, cost, and ease of replacement.

In step 620, as described in greater detail above, the device provides an indication of the OIR time for the plurality of device modules for display to a user. The indication may be an electronic display, one or more LEDs, or a thermo-chromic strip. In some embodiments, one or more LED flash patterns may be used to display the determined OIR time. The flash patterns may include flash count/frequency, flash interval and/or duration, and flash color, which may be varied and used sequentially or in combination to indicate the OIR time value. In addition, the indication of the OIR time may be provided to a user device, such as a smartphone, which may, in some embodiments, be connected to room system devices such an air conditioner unit to modify the operating temperature and slow the temperature increase, particular for a fan tray OIR. Procedure 600 then ends at step 625.

It should be noted that while certain steps within procedure 600 may be optional as described above, the steps shown in FIG. 6 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

Thus, the techniques described herein provide a readily visible indication of OIR time for a networking rack containing a plurality of device modules, enabling a user to easily determine how much time is needed to replace a faulty or out of date device module, particularly a fan tray. In particular, an intelligent software process is described configured to estimate the real-time thermal status of the device module temperatures and available device module OIR time-limit and to provide a convenient user interface to display OIR information to the user. In this way, product reliability is improved and undesirable system shutdowns due to overheating or thermal runaway can be avoided. The techniques are independent of the system configuration and the operating ambient condition since it uses real-time device temperature information.

While there have been shown and described illustrative embodiments that provide for indicating module online insertion and removal (OIR) time, it is to be understood that various other adaptations and modifications may be made within the spirit and scope of the embodiments herein. For example, while exemplary embodiments relate to fan tray OIR, the techniques described herein may also be used for removal/replacement of other device modules, such as power supplies, where operating power levels and dissipation of power by device modules (time to minimum power) would be considered, in other embodiments.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method comprising:
   determining, by a device in a modular networking rack, an online insertion and removal (OIR) time for a particular device module of a plurality of device modules contained within the modular networking rack;
   determining, by the device, an OIR time for the plurality of device modules based on the OIR time for the particular device module; and
   providing, by the device, an indication of the OIR time for the plurality of device modules for display to a user.

2. The method of claim 1, wherein the plurality of device modules includes one or more line cards, one or more fabric cards, one or more route processor cards, one or more power supplies, or one or more fan trays.

3. The method of claim 1, wherein the OIR time for the plurality of device modules is a fan tray OIR time for replacing a fan tray in the modular networking rack.

4. The method of claim 1, wherein determining the OIR time for the plurality of device modules comprises:
   determining, by the device, a minimum OIR time by comparing the OIR time for the particular device module to an OIR time for one or more of the plurality of device modules.

5. The method of claim 1, wherein determining the OIR time for the particular device module comprises:

determining at least one of: a power dissipation rate of the particular device module, a maximum permissible temperature for the particular device module, and a heating characteristic in no-airflow conditions for the particular device module.

6. The method of claim 1, further comprising:
causing, by the device, a determination of at least one of: an operating temperature of the particular device module or an air flow rate at the particular device module.

7. The method of claim 1, wherein the indication of the OIR time for the plurality of device modules comprises a flash pattern emitted by a display to the user.

8. The method of claim 7, wherein the flash pattern includes a flash count, a flash interval, and a flash color.

9. The method of claim 7, wherein the flash pattern indicates a numerical digit of the OIR time for the plurality of device modules.

10. The method of claim 7, wherein the flash pattern includes at least one solid color indicating a pause between numerical digits of the OIR time for the plurality of device modules.

11. The method of claim 7, wherein the flash pattern indicates a numerical range for the OIR time for the plurality of device modules.

12. The method of claim 7, wherein the indication of the OIR time for the plurality of device modules further comprises a label to interpret the flash pattern.

13. The method of claim 7, wherein the display is a single LED.

14. The method of claim 7, wherein the display comprises a plurality of LEDs, each representing a different numerical digit of the OIR time for the plurality of device modules.

15. The method of claim 1, wherein the indication of the OIR time for the plurality of device modules includes a thermos-chromic liquid crystal display.

16. The method of claim 1, wherein the indication of the OIR time for the plurality of device modules is provided for display on a user device.

17. The method of claim 1, further comprising:
sending, by the device, the OIR time for the plurality of device modules to a room monitoring system configured to control ambient room temperature.

18. The method of claim 1, wherein the device is a system controller.

19. An apparatus comprising:
one or more network interfaces to communicate with a network;
a processor coupled to the network interfaces and configured to execute one or more processes; and
a memory configured to store a process executable by the processor, the process when executed configured to:
determine an online insertion and removal (OIR) time for a particular device module of a plurality of device modules contained within the modular networking rack;
determine an OIR time for the plurality of device modules based on the OIR time for the particular device module; and
provide an indication of the OIR time for the plurality of device modules for display to a user.

20. A tangible, non-transitory, computer-readable media having software encoded thereon, the software when executed by a processor of a device in a network configured to:
determine an online insertion and removal (OIR) time for a particular device module of a plurality of device modules contained within the modular networking rack;
determine an OIR time for the plurality of device modules based on the OIR time for the particular device module; and
provide an indication of the OIR time for the plurality of device modules for display to a user.

* * * * *

UNITED STATES PATENT AND TRADEMARK OFFICE
CERTIFICATE OF CORRECTION

PATENT NO. : 10,387,278 B2
APPLICATION NO. : 15/643661
DATED : August 20, 2019
INVENTOR(S) : Rohit Dev Gupta It is certified that error appears in the above-identified patent and that said Letters Patent is hereby corrected as shown below:

In the Specification

Column 5, Line 41, please amend as shown:
clarity for displaying OIR time code information. In particu Column 7, Line 38, please amend as shown:
determine, from the comparison, a minimum OIR time for Signed and Sealed this
Fourteenth Day of April, 2020

Andrei Iancu
*Director of the United States Patent and Trademark Office*